United States Patent [19]

Dimyan et al.

[11] 4,153,948

[45] May 8, 1979

[54] ADJUSTABLE MAGNETIC BIAS FIELD STRUCTURE FOR MAGNETIC BUBBLE DEVICES

[75] Inventors: Magid Y. Dimyan, Richardson, Tex.; John C. Unger, San Diego, Calif.

[73] Assignee: Burroughs Corporation, Detroit, Mich.

[21] Appl. No.: 881,492

[22] Filed: Feb. 27, 1978

[51] Int. Cl.² ............................................. G11C 19/08
[52] U.S. Cl. .......................................... 365/28; 365/2
[58] Field of Search ...................................... 365/2, 28

[56] References Cited

U.S. PATENT DOCUMENTS 3,927,397   12/1975   Chow et al. ............................. 365/2

OTHER PUBLICATIONS

IBM Technical Disclosure Bulletin – vol. 16, No. 11, Apr. 1974, pp. 3692–3693.

Primary Examiner—James W. Moffitt
Attorney, Agent, or Firm—Dale V. Gaudier; Edward J. Feeney, Jr.; Kevin R. Peterson

[57] ABSTRACT

An adjustable magnetic bias field structure for magnetic bubble devices. A pair of parallel facing magnetically permeable plates are adjustably separated by a number of threaded magnetically hard cylindrical rods or slugs slotted at one end. Threaded plastic rings fastened around holes provided in the pair of permeable plates engage the threads of the slotted rods to provide the adjustment feature. A magnetic bubble device is placed between the two permeable plates.

10 Claims, 2 Drawing Figures

ADJUSTABLE MAGNETIC BIAS FIELD STRUCTURE FOR MAGNETIC BUBBLE DEVICES

BACKGROUND OF THE INVENTION

1. Field of the Invention

The invention relates to magnetic bubble devices and more particularly to an adjustable magnetic bias field structure for these magnetic bubble devices.

2. Prior Art

Magnetic domain or bubble devices are well-known in the art. These devices generally comprise a thin film of magnetic material in which small cylindrical areas can be generated and maintained. Domain propagation is along Permalloy tracks laid down on the surface of the film.

A magnetic bubble device requires a permanent magnetic bias field extending normal to the surface of the thin film in order to maintain the domains in a cylindrical form. The bias field must be maintained uniform within a fairly narrow range of about ±1 oersted, especially if a number of magnetic bubble chips are to be mounted on a single substrate as is common in current practice. Generally, the domains in the thin film are propagated along Permalloy tracks by a rotating field generated by a field coil assembly which surrounds the substrates. The substrate-field coil assembly, in turn, is placed within the permanent magnetic bias field structure.

Many magnetic bias field structures have been suggested in the prior art. An early proposal was to use two slabs or plates of magnetically "hard" (low permeability) material (such as barium ferrite) between which a magnetic bubble device would be placed. However, this construction was soon found to have a major drawback in that the magnetic field produced between the two plates is not very uniform since the air gap at the edges of the plates causes distortion of the magnetic field through the well-known "edge-effect" caused by the distortion of the magnetic field lines near the edges of the magnetic plates. Due to the absence of adjacent magnetic dipoles beyond the edges of a magnetic material, field lines will tend to bend slightly outward beyond the edges of the magnetic material. This causes the number of field lines per unit area (flux) to be slightly lower near the edges. Consequently, the magnetic field between two magnetic plates tends to be non-homogeneous near the air gap between the edges of the plates.

It has been recognized that a bias structure utilizing what is known as a "Watson" magnet will give substantially better field uniformity over a larger area than the structure previously described. In the Watson magnet configuration two magnetically "hard" bar magnets are placed between two magnetically "soft", highly permeable plates (such as soft ferrite or Permalloy) to provide a uniform magnetic field between the plates. Such a structure is described in "Permanent Magnet Bias Schemes for Bubble Memory Applications," William Lyons, IBM Technical Report TR 22.1633, 8 May 1973, pp. 1–12. A variation of this technique, shown in IBM Tech. Discl. Bull. Vol. 16, No. 7, Dec. 1973, pp. 2129–30, uses a number of cylindrical slugs instead of bar magnets to produce the required bias field with excellent homogeneity. Since in the above-described devices the magnetically "hard" bar magnets or slugs are in contact with the magnetically "soft" plates near their edges, a continuous and uninterrupted path is provided for the magnetic field between the two plates near their edges. As a consequence edge effects are reduced and field uniformity is improved over a larger portion of the plates.

Usually, the bias structure is first assembled and then magnetized to the required value by use of a magnet charger. It is also known to use a succession of two oppositely directed external magnetic fields to adjust a fixed magnetic biasing structure, as is shown in U.S. Pat. No. 3,931,618. However, because the bias field sometimes varies slightly from package to package, a method for mechanically "fine tuning" or adjustment of the field is required.

Various adjustment schemes for magnetic bias structures have been proposed in the prior art. One such technique is shown in U.S. Pat. No. 3,927,397, in which a pair of parallel facing magnetically permeable plates, each having a ferromagentic slab laminated thereto, are adjustably spaced apart by four threaded non-magnetic bolts. The non-magnetic bolts are adjustable by means of a slotted head provided at one end of each bolt. A magnetic bubble device would be placed between the parallel plates. This structure suffers from the disadvantages that a pair of specially laminated plate structures must be used and, since an air gap is still present between the two parallel facing plates, edge effects produce a non-homogeneous magnetic field near the outer edges of the biasing structure.

Another adjustable magnetic biasing structure is shown in U.S. Pat. No. 3,711,841. A pair of parallel facing plates of high magnetic permeability are separated by a pair of bar magnets in the familiar Watson type magnet arrangement. A magnetic bubble device is placed within the volume defined by the two plates and the two bar magnets. The separation between the plates, and hence the strength of the magnetic field, is adjustable by means of four non-magnetic threaded bolts. While this structure reduces edge effects somewhat by allowing a continuous path for the magnetic field through the plates and contacting bar magnets, this structure suffers from two disadvantages: first, this structure requires a pair of relatively "hard" (low permeability) bar magnets to provide the return path for the magnetic field near the edges; and second, the act of adjusting the air gap by means of the non-magnetic bolts may cause a portion of one of the magnetic plates to lift away from a portion of a bar magnet and as a consequence will produce a distortion of the flow of the magnetic field. This will cause a non-uniform field to be produced in the vicinity of the air gap resulting in degradation of magnetic bubble device performance.

An arrangement similar to the mechanically adjustable air-gap Watson-type magnetic biasing structure shown in U.S. Pat. No. 3,711,841, is described in "Magnetic Bubble Mass Memory," Michaelis and Bonyhard, *IEEE Transactions on Magnetics,* Vol. MAG-9, No. 3, Sept. 1973, pp. 436–440. This structure suffers from a similar disadvantage in that non-magnetic screw adjustment of the plate separation will cause magnetic field distortions along portions of the plates which are moved out of contact with the pair of bar magnets.

SUMMARY OF THE INVENTION

These and other problems of prior art devices are overcome in the present invention by providing an adjustable magnetic bias field structure comprising a pair of facing, substantially parallel magnetic plates of high permeability adjustably separated by a plurality of dual opposingly threaded cylindrical magnetic rods of low magnetic permeability, each rod being slotted at one end. Holes are provided in the magnetic plates through which the threaded rods extend. Threaded plastic rings or washers fastened around the holes engaged the threads of the rods. Magnetic bubble devices are placed between the two permeable plates.

This novel structure has several advantages over prior art devices. First, the use of magnetically "hard" (low permeability) threaded rods to provide the adjustment feature insures that a continuous and uninterrupted path for the magnetic field between the magnetically soft (high permeability) plates will be provided at all times. Since the present invention does not rely on the adjustment of a magnetically discontinuous air-gap between two magnetic pieces, edge-effects are minimized and excellent field homogeneity is achieved between the pair of facing magnetic plates. Second, the need for a pair of special laminated magnetic plates is eliminated since field homogeneity is achieved without the use of an adjustable, magnetically discontinuous air gap between the plates. Third, the simplified biasing structure of the present invention eliminates the need for a pair of magnetically hard bar magnets as is used in the typical screw-adjustable Watson-type magnetic biasing arrangement.

DESCRIPTION OF THE PREFERRED EMBODIMENT

Figure 1:
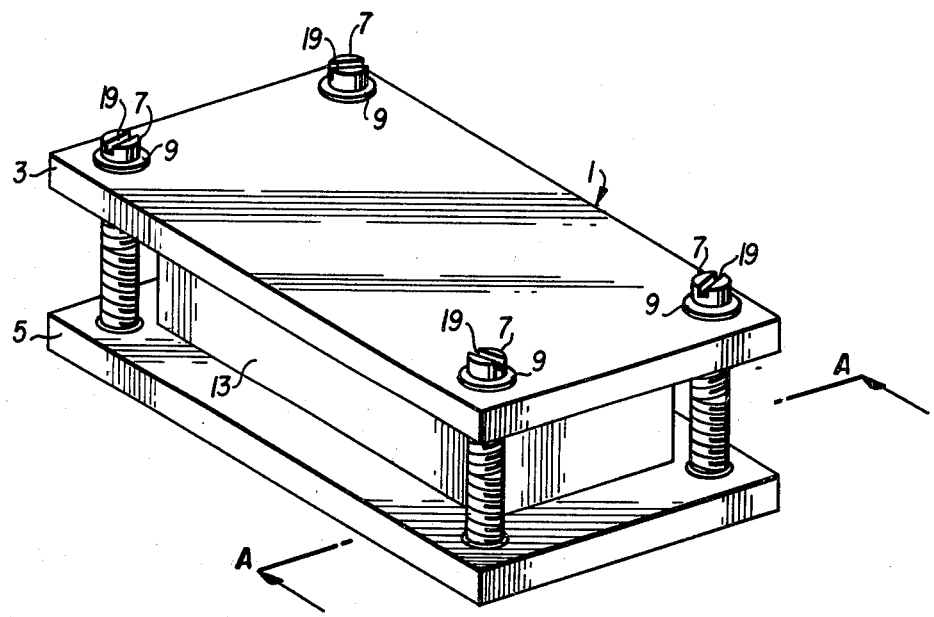
FIG. 1 is a perspective view showing the various components comprising the adjustable magnetic field bias structure of the present invention.

Referring to FIG. 1 there is shown a perspective view of the adjustable magnetic field biasing structure 1 of the present invention which basically comprises a pair of facing, substantially parallel plates 3 and 5. Both upper plate 3 and lower plate 5 are identical in construction and are composed of a thin sheet of magnetically "soft" (high permeability) material, such as manganesezinc ferrite or Permalloy. Plates 3 and 5 are adjustably separated by threaded spacer means such as the four threaded magnetic rods or slugs labeled 7 in FIG. 1. Threaded rods 7 are preferably formed of magnetically "hard" (low permeability) material such as strontium ferrite or barium ferrite. Each cylindrical threaded rod 7 has a slot 19 provided at one end. The upper threads 21 of the rods are preferably left-hand threads of standard pitch and depth, while the lower threads 23 are right-hand threads of identical pitch and depth.

Figure 2:
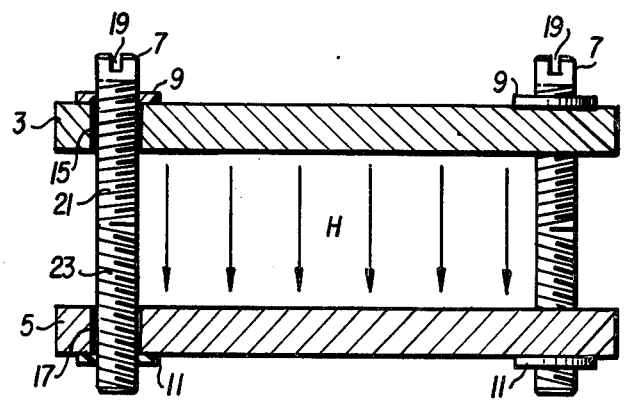
FIG. 2 is a partial sectional view of FIG. 1 taken along line A-A which more clearly shows the adjustment feature of the present invention.

Threaded rods 7 fit into holes 15 bored through plate 3 and holes 17 bored through plate 5, as is more clearly shown in FIG. 2. Holes 15 and 17 are slightly larger in diameter than threaded rods 7. Upper plate 3 is provided with a number of plastic rings or washers 9, which are fastened concentrically about holes 15 on the upper surface of plate 3. Washers 9 may be fastened to plate 3 by conventional adhesives, such as epoxy. Each washer 9 is provided with internal left-hand threads to movably engage the threaded portion 21 of its associated magnetic rod 7.

Similarly, lower plate 5 is provided with a number of plastic washers 11, which are fastened concentrically about holes 17 on the lower surface of plate 5. Each washer 11 is provided with internal right-hand threads to movably engage the threaded portion 23 of its associated magnetic rod 7. Washers 9 and 11 are preferably comprised of a dimensionaly stable plastic, such as Teflon or Delrin.

A utilization device, such as a magnetic bubble device or array of such devices, designated as 13 in FIG. 1 would be placed between upper plate 3 and lower plate 5 within the confines of the four threaded rods 7.

In operation, the assembled magnetic field biasing structure 1 would be magnetized to the desired value by use of a magnet charger (not shown). Fine adjustment of the magnetic field H shown in FIG. 2 would be made by rotating one or more of threaded rods 7. As is clearly shown in FIG. 2, slot 19 provided at the upper ends of rods 7 allows an operator to turn the rods, preferably using a non-magnetic screw-driver. A clockwise rotation of the rods 7 (as seen from the top of FIGS. 1 or 2) will cause the bottom plate 5 to be drawn closer to the top plate 3. Of course, turning the rods 7 counter-clockwise (as seen from the top of FIGS. 1 and 2) would increase the separation between plates 3 and 5.

Since the separation between plates 3 and 5 determines the magnitude of the magnetic field H, then the field can easily be adjusted with this structure without degrading the field homogeneity. The explanation for this is that the magnetically "hard" threaded rod magnets always stay in intimate contact with the magnetically "soft" plates, thus no appreciable air gaps between the two kinds of magnets occur at any time, ensuring magnetic field homogeneity. This results in a great improvement in field homogeneity between the two plates as compared to prior art Watson-type biasing schemes which have depended on varying the air gap spacing between the "hard" and "soft" magnets, but which also degrade the field uniformity.

It will be noted that although the invention has been described with reference to certain specific types of magnetic materials, other types of magnetically "hard" and "soft" materials could be readily substituted therefor as is well-known in the art.

While the adjustable magnetic field biasing structure of the present invention has been described in considerable detail, it is understood that various changes, modifications, and other applications of the invention may occur to persons of ordinary skill in the art without departing from the spirit and scope of the invention as is defined in the appended claims.

What is claimed is:

1. Magnetic bias field apparatus comprising:
   a first planar magnet means;
   a second planar magnet means; and
   magnetic spacer means each comprising opposingly threaded magnetic bolts of low magnetic permeability associated with said first and second planar magnet means for adjustably separating said first and second planar magnet means in a substantially parallel facing relationship.

2. The magnetic bias field apparatus of claim 1 wherein said first and second planar magnet means and said magnetic bolts are made of permanently magnetic materials.

3. The magnetic bias field apparatus of claim 1 wherein said first and second planar magnet means comprise an identical pair of thin magnetic plates of substantially rectangular shape.

4. The magnetic bias field apparatus of claim 1 wherein said first and second planar magnet means include a plurality of openings disposed near the edges thereof and wherein said openings are of a diameter greater than the diameter of said magnetic bolts for reception thereof.

5. The magnetic bias field apparatus of claim 4 wherein each of said planar magnet means further includes a plurality of washer means, each of said washer means being fastened concentric to each of said openings, and each of said washer means having complementary internal threads for movably engaging the threads of one of said magnetic bolts disposed in said openings.

6. The magnetic bias field apparatus of claim 5 wherein said washer means are composed of a non-magnetic material.

7. The magnetic bias field apparatus of claim 1 wherein each of said magnetic bolts includes a slot formed on one end thereof.

8. Magnetic bias field apparatus comprising:
an upper rectangular permeable magnetic plate;
a lower rectangular permeable magnetic plate, said upper and lower magnetic plates having an opening disposed near each corner thereof;
a plurality of non-magnetic internally threaded washers, said washers being fastened concentric to each of said openings disposed on said upper and lower magnetic plates; and
a plurality of opposingly threaded magnetic bolts of low magnetic permeability associated with said openings disposed in said upper and lower magnetic plates for adjustably separating said upper and lower magnetic plates in a substantially parallel facing relationship, wherein said magnetic bolts are of a diameter less than that of said openings and wherein said magnetic bolts are externally threaded for movable engagement with said washers.

9. The magnetic bias field apparatus of claim 8 wherein each of said magnetic bolts includes an upper portion and a lower portion, said upper and lower portions having opposed external threads disposed thereon.

10. The magnetic bias field apparatus of claim 9 wherein said washers fastened to said upper plate have internal threads of like type to that of said upper portion of said threaded bolts for movable engagement therewith, and wherein said washers fastened to said lower plate have internal threads of like type to that of said lower portion of said threaded bolts for movable engagement therewith.

* * * * *